United States Patent
Zhao et al.

(10) Patent No.: US 10,182,492 B2
(45) Date of Patent: Jan. 15, 2019

(54) AIRTIGHT STRUCTURE

(71) Applicant: CHAMP TECH OPTICAL (FOSHAN) CORPORATION, Foshan (CN)

(72) Inventors: Xiao-Yu Zhao, Foshan (CN); Chi-Yuan Lai, New Taipei (TW); Meng Fu, Foshan (CN)

(73) Assignee: CHAMP TECH OPTICAL (FOSHAN) CORPORATION, Foshan (CN)

( * ) Notice: Subject to any disclaimer, the term of this patent is extended or adjusted under 35 U.S.C. 154(b) by 0 days.

(21) Appl. No.: 15/495,953

(22) Filed: Apr. 24, 2017

(65) Prior Publication Data

US 2018/0279463 A1  Sep. 27, 2018

(30) Foreign Application Priority Data

Mar. 24, 2017 (CN) .......................... 2017 1 0182158

(51) Int. Cl.
   *F28D 15/00* (2006.01)
   *H05K 1/02* (2006.01)
   *F28F 3/12* (2006.01)

(52) U.S. Cl.
   CPC ............. *H05K 1/0203* (2013.01); *F28F 3/12* (2013.01); *F28F 2230/00* (2013.01); *F28F 2275/06* (2013.01)

(58) Field of Classification Search
   CPC ........ F28D 15/0233; F28D 15/04; F28F 3/12; F28F 2230/00; F28F 2275/06; H05K 1/0203
   USPC ...................................................... 165/104.26
   See application file for complete search history.

(56) References Cited

U.S. PATENT DOCUMENTS

| 2,039,602 | A  | * | 5/1936 | Luebbe ..................... F17B 1/00 220/216 |
| 6,957,692 | B1 | * | 10/2005 | Win-Haw ........... F28D 15/0233 165/104.21 |
| 7,942,196 | B2 | * | 5/2011 | Lai ....................... F28D 15/0233 165/104.21 |
| 2003/0173064 | A1 | * | 9/2003 | Ueki ................... F28D 15/0233 165/104.21 |
| 2013/0126132 | A1 | * | 5/2013 | Chen ....................... F28D 15/04 165/104.26 |

* cited by examiner

*Primary Examiner* — Davis Hwu
(74) *Attorney, Agent, or Firm* — ScienBiziP, P.C.

(57) ABSTRACT

An airtight structure includes a first plate having a first surface and a second surface opposite to the first surface, a second plate mounted on the second surface of the first plate, a wick structure mounted between the first plate and the second plate, a first fixed pin welded with the first plate and the second plate, and a second fixed pin welded with the first plate and the second plate. The second plate bonds to form a cup portion. The cup portion and the first plate together define a cavity. The wick structure is received in the cavity, a bottom surface of the cup portion forms a first through hole for receiving the first fixed pin therein. An outer periphery of the cup portion forms a second through hole. The second through hole is spaced apart from the first through hole.

10 Claims, 1 Drawing Sheet

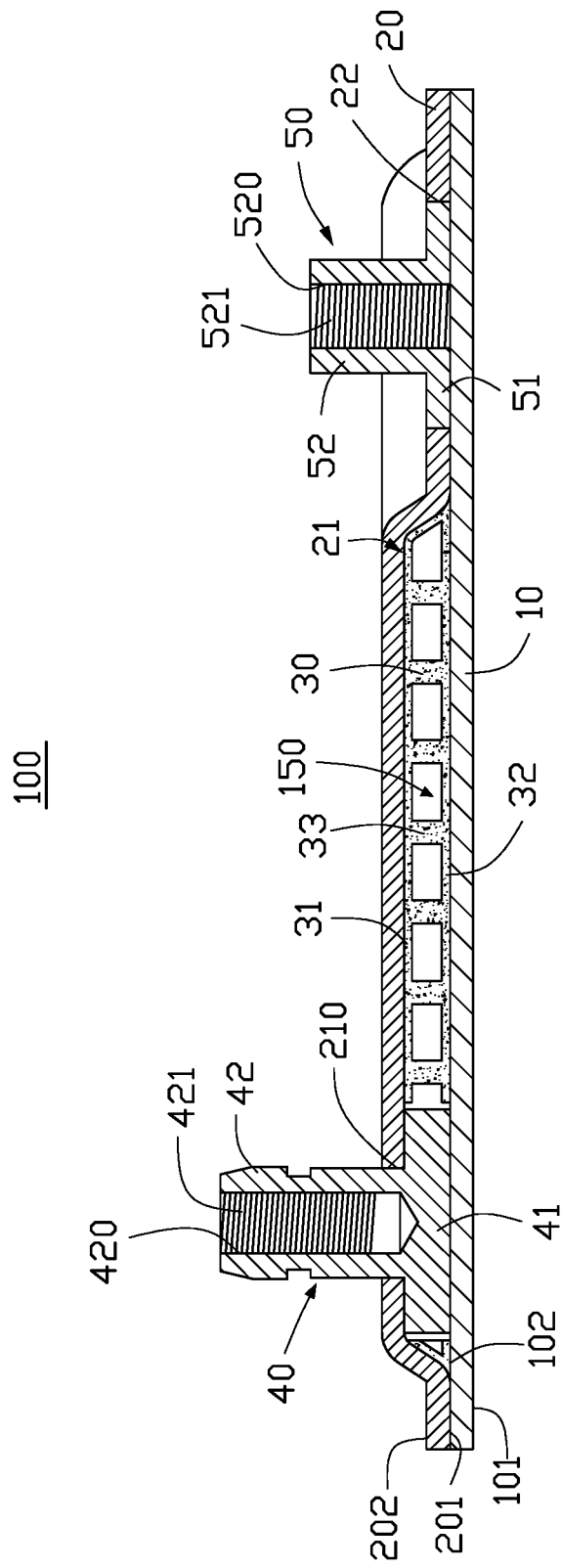

AIRTIGHT STRUCTURE

CROSS-REFERENCE TO RELATED APPLICATIONS

This application claims priority to Chinese Patent Application No. 201710182158.9 filed on Mar. 24, 2017, the contents of which are incorporated by reference herein.

FIELD

The subject matter herein generally relates to a heat dissipation structure, especially, relates to an airtight structure for heat dissipation of a circuit.

BACKGROUND

Generally, an airtight structure is configured on a circuit for heat dissipation.

The airtight structure includes a first plate, a second plate and a wick structure mounted between the first plate and the second plate. The first plate and the second plate have a plurality of through holes for corresponding screws. The crews correspondingly enter the through holes to fix the first plate on the second plate and also make the airtight structure connect with the circuit. However, an additional portion is mounted between the airtight structure and the circuit. The screws connect the airtight structure and the circuit by the additional portion.

Thus, the additional portion decrease stability between the airtight structure and the circuit, further, the screw in the through holes are easily loosened, which impacts the stability between the airtight structure and the circuit.

BRIEF DESCRIPTION OF THE DRAWINGS

Implementations of the present technology will now be described, by way of example only, with reference to the attached FIGURES.

FIG. 1 is a cross-sectional view of an airtight structure of the present disclosure.

DETAILED DESCRIPTION OF EMBODIMENTS

It will be appreciated that for simplicity and clarity of illustration, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure. The description is not to be considered as limiting the scope of the embodiments described herein.

Several definitions that apply throughout this disclosure will now be presented. The term "comprising" means "including, but not necessarily limited to"; it specifically indicates open-ended inclusion or membership in a so-described combination, group, series and the like. The term "coupled" is defined as connected, whether directly or indirectly through intervening components, and is not necessarily limited to physical connections. The connection can be such that the objects are permanently connected or releasably connected.

An airtight structure 100 of the present disclosure includes a first plate 10, a second plate 20, a wick structure 30 mounted between the first plate 10 and the second plate 20, a first fixed pin 40 welds with the first plate 10 and the second plate 20, and a second fixed pin 50 welds with the first plate 10 and the second plate 20.

The first plate 10 is a level board and has a uniform thickness. The first plate 10 has a first surface 101 and a second surface 102 opposite to the first surface 101. The second plate 20 mounts on the second surface 102 of the first plate 10.

The second plate 20 is a bonding plate and has uniform thickness. The second plate 20 is made of the same materials as the first plate 10. A center of the second plate 20 bonds to the first plate 10 to form a cup portion 21. A periphery of the cup portion 21 is flat board. A cross-section of the cup portion 21 is a trapezoid. A radius of the cup portion 21 decreases away from the first plate 10. A bottom surface of the cup portion 21 forms a first through hole 210. The first through hole 210 is to receive the first fixed pin 40 therein. While the first plate 10 is positioned on the second plate 20, the cup portion 21 of the second plate 20 and the first plate 10 together define a cavity 150. The wick structure 30 and the first fixed pin 40 are received in the cavity 150.

Further, the second plate 20 has a top surface 201 and the bottom surface 202 opposite to the top surface 201. The first through hole 210 extends through the top surface 201 and the bottom surface 202. The second plate 20 has a second through hole 22 extended through the top surface 201 and the bottom surface 202. The second through hole 22 is spaced apart from the first through hole 210. The second through hole 22 receives the second fixed pin 50 therein.

The wick structure 30 is received in the cavity 150, the first fixed pin 40 is also in the cavity 150. The wick structure 30 is spaced from the first fixed pin 40. Specifically, the wick structure 30 includes a first portion 31 mounted on the top surface 201 corresponding to the cup portion 21, a second portion 32 mounted on the second surface 102 of the first plate 10 and a plurality of third portions 33 connected with the first portion 31 and the second portion 32. The plurality of third portions 33 is perpendicular with the first portion 31 and the second portion 32. Two adjacent third portions 33 have equal spacing.

The first portion 31 has a same thickness as the second portion 32. A cross-section of the third portions 33 has a rectangular shape. A height and a thickness of the third portion 33 are greater than the thickness of the first portion 31.

The first fixed pin 40 is T-shaped. The first fixed pin 40 includes a first body 41 and a first extending portion 42 extended perpendicularly from the first body 41. The first extending portion 42 has a connection hole 420. An inner surface of the first extending portion 42 forms a screw thread 421 thereon.

While the first fixed pin 40 welds with the first plate 10 and the second plate 20, the first body 41 is received in the cavity 150. A bottom surface of the first body 41 contacts to the second surface 102 of the first plate 10, a top surface of the first body 41 contacts to the top surface 201 of the second plate 20. The first extending portion 42 enters the first through hole 210 and exposes out of the cavity 150. An inner surface of the first through hole 210 contacts to the first extending portion 42.

The second fixed pin 50 is T-shaped. The second fixed pin 50 includes a second body 51 and a second extending portion 52 extended perpendicularly from the second body 51. A thickness of the second body 51 is equal to a thickness of the second plate 20 and less than a thickness of the first body 41. The second extending portion 52 has a second connection hole 520. The second hole 520 extends through a top surface of the second extending portion 52 to a bottom surface of the second body 51. An inner surface of the second connection hole 520 forms a screw thread 521 thereon.

While the second fixed pin 50 is welded with the first plate 10 and the second plate 20, the second body 51 is received in the second through hole 22. A bottom surface of the second body 51 contacts the second surface 102 of the first plate 10, the second extending portion 52 extends beyond the second plate 20. An inner surface of the second through hole 22 contacts the second body 51.

In the present disclosure, the second plate 20 has the first through hole 210 and the second through hole 22, the first fixed pin 40 and the second fixed pin 50 are welded with the first plate 10 and the second plate 20 through the first through hole 210 and the second through hole 22. Thus, the airtight structure 100 can connect directly with a circuit rather than by a additional portion.

Further, the first through hole 210 and the second through hole 22 are on the second plate 20, thus, the cavity 150 defined by the first plate 10 and the second plate 20 has a good sealing.

The embodiments shown and described above are only examples. Many details are often found in the art such as the other features of An airtight structure. Therefore, many such details are neither shown nor described. Even though numerous characteristics and advantages of the present technology have been set forth in the foregoing description, together with details of the structure and function of the present disclosure, the disclosure is illustrative only, and changes can be made in the detail, including in matters of shape, size and arrangement of the parts within the principles of the present disclosure up to, and including the full extent established by the broad general meaning of the terms used in the claims. It will therefore be appreciated that the embodiments described above can be modified within the scope of the claims.

What is claimed is:

1. An airtight structure, comprising:
   a first plate having a first surface and a second surface opposite to the first surface;
   a second plate mounted on the second surface of the first plate;
   a wick structure mounted between the first plate and the second plate;
   a first fixed pin welded with the first plate and the second plate;
   a second fixed pin welded with the first plate and the second plate;
   wherein, the second plate bonds to form a cup portion, the cup portion and the first plate together define a cavity, the wick structure is received in the cavity, a bottom surface of the cup portion forms a first through hole for receiving the first fixed pin therein, an outer periphery of the cup portion forms a second through hole, the second through hole is spaced apart from the first through hole, an inner surface of the first through hole contacts to the first fixed pin, and the an inner surface of the second through hole contacts to the second fixed pin, first fixed pin is T-shaped, the first fixed pin comprises a first body and a first extending portion, the first extending portion extended perpendicularly from the first body, the first extending portion has a first connection hole, an inner surface of the connection hole forms a screw thread, while the first fixed pin is welded with the first plate and the second plate, the first body is received in the cavity, a bottom surface of the first body contacts the second surface of the first plate, a top surface of the first body contacts the top surface of the second plate.

2. The airtight structure of claim 1, wherein the second plate has a top surface and a bottom surface opposite to the top surface, both the first through hole and the second through hole extend through the top surface and the bottom surface of the second plate.

3. The airtight structure of claim 1, wherein the second fixed pin is T-shaped, the second fixed pin comprises a second body and a second extending portion extended perpendicularly from the second body, a thickness of the second body is equal to a thickness of the second plate and less than a thickness of the first body.

4. The airtight structure of claim 3, wherein the second extending portion forms a second connection portion, the second connection portion extends through a top surface of the second extending portion to a bottom surface of the second body.

5. The airtight structure of claim 3, wherein while the second fixed pin is welded with the first plate and the second plate, the second body is received in the second through hole, the bottom surface of the second body contacts the second surface of the first plate.

6. The airtight structure of claim 3, wherein the wick structure is received in the cavity, the first fixed pin is also in the cavity, the wick structure is space from the first fixed pin.

7. The airtight structure of claim 6, wherein the wick structure comprises a first portion mounted on the top surface corresponding to the cup portion, a second portion mounted on the second surface of the first plate and a plurality of the third portions connected with first portion and the second portion.

8. The airtight structure of claim 7, wherein the plurality of third portion is perpendicular with the first portion and the second portion, two adjacent third portions have equal spacing.

9. The airtight structure of claim 7, wherein the first portion has a same thickness as the second portion, a cross section of the third portions has a rectangular shape.

10. The airtight structure of claim 9, wherein a height and a thickness of the third portion are greater than a thickness of the first portion.

* * * * *